(12) United States Patent
Park et al.

(10) Patent No.: US 8,901,563 B2
(45) Date of Patent: Dec. 2, 2014

(54) ORGANIC LIGHT-EMITTING DISPLAY DEVICE AND METHOD OF MANUFACTURING THE SAME

(75) Inventors: Sang-Il Park, Yongin (KR); Chaun-Gi Choi, Yongin (KR); Tae-Kyung Ahn, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/356,923

(22) Filed: Jan. 24, 2012

(65) Prior Publication Data

US 2012/0235147 A1 Sep. 20, 2012

(30) Foreign Application Priority Data

Mar. 14, 2011 (KR) .................. 10-2011-0022449

(51) Int. Cl.
*H01L 51/52* (2006.01)
*H01L 27/12* (2006.01)
*H01L 27/32* (2006.01)

(52) U.S. Cl.
CPC ......... *H01L 27/3262* (2013.01); *H01L 27/3248* (2013.01); *H01L 27/1255* (2013.01); *H01L 51/5212* (2013.01); *H01L 27/3265* (2013.01); *H01L 2227/323* (2013.01)
USPC .................. 257/59; 257/72; 257/71; 257/40; 438/29; 438/34

(58) Field of Classification Search
CPC .............. H01L 29/786; H01L 27/1255; H01L 27/3246; H01L 27/3248; H01L 27/3258; H01L 51/0023; H01L 51/0512; H01L 51/5218
USPC .......................................... 257/59, 72; 438/29
See application file for complete search history.

(56) References Cited

U.S. PATENT DOCUMENTS

| | | | | |
|---|---|---|---|---|
| 8,324,629 | B2 * | 12/2012 | Jeong et al. | 257/72 |
| 2006/0091785 | A1 | 5/2006 | Lee et al. | |
| 2008/0121872 | A1 * | 5/2008 | Choi et al. | 257/40 |
| 2009/0073335 | A1 * | 3/2009 | Yagi et al. | 349/39 |
| 2010/0006833 | A1 * | 1/2010 | Ha et al. | 257/43 |
| 2010/0072885 | A1 * | 3/2010 | Watanabe et al. | 313/504 |
| 2010/0224881 | A1 * | 9/2010 | Park et al. | 257/71 |
| 2010/0270538 | A1 * | 10/2010 | Kang | 257/40 |
| 2011/0108831 | A1 * | 5/2011 | Jeong et al. | 257/43 |

FOREIGN PATENT DOCUMENTS

| | | |
|---|---|---|
| EP | 2214211 A2 | 1/2010 |
| EP | 2214211 A3 | 1/2010 |
| EP | 2239780 A1 | 3/2010 |
| KR | 10-2006-0037732 A | 5/2006 |
| KR | 10-2008-0106148 A | 12/2008 |
| KR | 10-2010-0073945 A | 7/2010 |

OTHER PUBLICATIONS

European Extended Search Report Dated Feb. 3, 2014.

* cited by examiner

*Primary Examiner* — Julia Slutsker
*Assistant Examiner* — Natalia Gondarenko
(74) *Attorney, Agent, or Firm* — Lee & Morse, P.C.

(57) ABSTRACT

An organic light-emitting display device includes an organic light-emitting device, a thin film transistor (TFT) electrically connected to the organic light-emitting device, and a capacitor electrically connected to the organic light-emitting device, the capacitor including a first electrode layer and a second electrode layer opposite to each other, and a first insulating layer interposed as a single layer between the first electrode layer and the second electrode layer.

16 Claims, 4 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2011-0022449, filed on Mar. 14, 2011, in the Korean Intellectual Property Office, the disclosure of which is incorporated herein in its entirety by reference.

BACKGROUND

1. Field

Example embodiments relate to an organic light-emitting display device, and more particularly, to an organic light-emitting display device including a capacitor having an increased capacity and a method of manufacturing the organic light-emitting display device.

2. Description of the Related Art

In organic light-emitting display devices that have recently attracted much attention, each pixel includes a thin film transistor (TFT), a capacitor, and an organic light-emitting device connected to the TFT and the capacitor. The organic light-emitting device emits light by receiving a proper driving signal from the TFT and the capacitor and displays a desired image.

In order to more stably display an image of an organic light-emitting display device, the capacitor is required to have a sufficient capacity. That is, when the capacitor has a sufficient capacity, an image can be more naturally displayed. However, if a size of the capacitor is merely increased to increase the capacity thereof, an emission area of the organic light-emitting device may be relatively decreased, which in turn, may decrease the brightness of the organic light-emitting device.

SUMMARY

Example embodiments provide a capacitor having an increased capacity and an organic light-emitting display device including the capacitor.

According to an aspect of the example embodiments, there is provided an organic light-emitting display device, including an organic light-emitting device, a thin film transistor (TFT) electrically connected to the organic light-emitting device, and a capacitor electrically connected to the organic light-emitting device, the capacitor including a first electrode layer and a second electrode layer opposite to each other, and a first insulating layer interposed as a single layer between the first electrode layer and the second electrode layer.

The first electrode layer may include a transparent electrode layer on the substrate, and a low resistance electrode layer on the transparent electrode layer.

The TFT may include a gate electrode including a same material with a same thickness as the first electrode layer of the capacitor, the gate electrode and first electrode layer being positioned directly on a same element, a second insulating layer on the gate electrode, an active layer on the second insulating layer, a third insulating layer on the active layer, the third insulating layer being a continuous layer with the first insulating layer, and source and drain electrodes on the third insulating layer and connected to the active layer, the source and drain electrodes including a same material to a same thickness as the second electrode layer of the capacitor.

The gate electrode may include a transparent electrode layer on the substrate, and a low resistance electrode layer on the transparent electrode layer.

The organic light-emitting device may include a pixel electrode connected to the TFT, an opposing electrode opposite to the pixel electrode, and an organic emission layer interposed between the pixel electrode and the opposing electrode.

The pixel electrode may include a transparent electrode layer on the substrate and connected to the organic emission layer, and a low resistance electrode layer on the transparent electrode layer and connected to the TFT.

According to another aspect of the example embodiments, there is provided a method of manufacturing an organic light-emitting display device, the method including forming an organic light-emitting device, forming a thin film transistor (TFT) electrically connected to the organic light-emitting device, and forming a capacitor electrically connected to the organic light-emitting device, the capacitor including a first electrode layer and a second electrode layer opposite to each other, and a first insulating layer interposed as a single layer between the first electrode layer and the second electrode layer.

The method may further include forming a pixel electrode of the organic light-emitting device, a gate electrode of the TFT, and the first electrode layer of the capacitor of a same layer on the substrate, forming a second insulating layer on the gate electrode of the TFT, forming an active layer on the second insulating layer, forming the first insulating layer on the first electrode layer of the capacitor and a third insulating layer on the active layer of a same layer, and forming the second electrode layer on the first insulating layer and source and drain electrodes on the third insulating layer of a same layer.

Each of the first electrode layer, the gate electrode, and the pixel electrode may include a transparent electrode layer formed on the substrate and a low resistance electrode layer formed on the transparent electrode layer.

The method may further include forming an organic emission layer on the pixel electrode, and forming an opposing electrode on the organic emission layer.

The organic emission layer may be formed on the exposed pixel electrode, and the pixel electrode is partially exposed by etching a pixel-defining layer formed on the pixel electrode.

BRIEF DESCRIPTION OF THE DRAWINGS

The above and other features and advantages of the example embodiments will become more apparent by describing in detail exemplary embodiments thereof with reference to the attached drawings in which.

DETAILED DESCRIPTION

Figure 1:
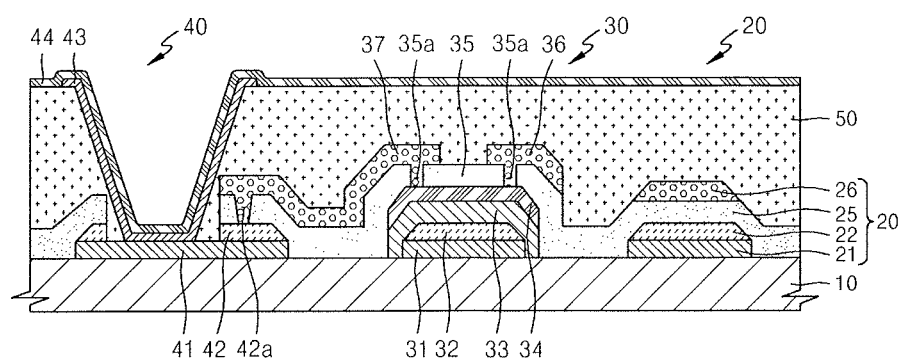
FIG. 1 is a cross-sectional view of an organic light-emitting display device according to example embodiments.

An exemplary embodiment will be described in detail with reference to FIG. 1. FIG. 1 is a cross-sectional view of an organic light-emitting display device according to an example embodiment.

As illustrated in FIG. 1, an organic light-emitting display device according to an embodiment includes a thin film transistor (TFT) 30, a capacitor 20, and an organic light-emitting device 40 on a substrate 10. FIG. 1 illustrates only a single pixel of the organic light-emitting display device, but the organic light-emitting display device includes a plurality of the pixels.

The organic light-emitting device 40, which is electrically connected to the TFT 30 and the capacitor 20, emits light. The organic light-emitting device 40 includes pixel electrodes 41 and 42 that are included in each pixel, an opposite electrode 44 which is a common electrode, and an organic emission layer 43 interposed between the pixel electrode 41 and the opposite electrode 44. Thus, if a voltage is applied to the pixel electrodes 41 and 42 from the TFT 30 and the capacitor 20, i.e., a proper voltage condition is formed between the pixel electrodes 41 and 42 and the opposite electrode 44, the organic emission layer 43 emits light.

The pixel electrode 41 may be a transparent electrode layer formed of, e.g., indium tin oxide (ITO), indium zinc oxide (IZO), or zinc oxide (ZnO), and the pixel electrode 42 may be a low resistance electrode layer formed of, e.g., molybdenum (Mo). The pixel electrodes 41 and 42 may partially form a multi-layered structure.

The opposite electrode 44 may include a semi-permeable reflecting layer formed of, e.g., Ag, Mg, Al, Pt, Pd, Au, Ni, Nd, Ir, Cr, Li, and/or Ca in a thin film type layer, or may include a light-transmissive metal oxide formed of, e.g., ITO, IZO, or ZnO.

The organic emission layer 43 interposed between the pixel electrodes 41 and 42 and the opposite electrode 44 may have a stacked structure in which an emitting layer (EML) and at least one of a hole injection layer (HIL), a hole transport layer (HTL), an electron injection layer (EIL), an electron transport layer (ETL), etc. are stacked. The pixel electrode 41, which is a transparent electrode layer, contacts the organic emission layer 43, and the pixel electrode 42, which is a low resistance electrode layer, connects source and drain electrodes 36 and 37 of the TFT 30 with the pixel electrode 41.

Although not shown in FIG. 1, a protection layer may further be formed on the opposite electrode 44. Further, the organic light-emitting display device may be sealed, e.g., by glass.

Reference numeral 50 denotes a pixel-defining layer. The organic emission layer 43 and the opposite electrode 44 may be formed on the pixel electrode 41 that is exposed by etching the pixel-defining layer 50.

Next, the TFT 30 includes gate electrodes 31 and 32 formed on the substrate 10, a second insulating layer 33 (or a gate insulating layer) covering the gate electrodes 31 and 32, an active layer 34 formed on the second insulating layer 33, a third insulating layer 35 (or an etching stop layer) covering the active layer 34, and the source and drain electrodes 36 and 37. Each of the source and drain electrodes 36 and 37 is connected to the active layer 34 via an aperture 35a of the third insulating layer 35.

A buffer layer (not shown) may further be formed on the substrate 10. The buffer layer may be formed of an inorganic material, e.g., silicon oxide.

The gate electrodes 31 and 32 may be formed as a single layer or a plurality of layers on the substrate 10. In the current embodiment, the gate electrodes 31 and 32 may be formed as a multi layer similar to the pixel electrodes 41 and 42, wherein the gate electrode 31 may be a transparent electrode layer and the gate electrode 32 may be a low resistance electrode layer.

The second insulating layer 33 may be formed of, e.g., silicon oxide, tantalum oxide, and/or aluminum oxide. However, example embodiments are not limited thereto.

The active layer 34 is formed on the second insulating layer 33. The active layer 34 may be formed of an oxide semiconductor, e.g., a G-I-Z-O layer [a(In$_2$O$_3$) b(Ga$_2$O$_3$)c(ZnO) layer], wherein a, b, and c are real numbers satisfying the conditions of a≥0, b≥0, and c>0, respectively. In another example, the active layer 34 may be a Hf—In—Zn—O layer.

The third insulating layer 35 covering the active layer 34 may be formed of, e.g., silicon oxide, tantalum oxide, and/or aluminum oxide. However, example embodiments are not limited thereto.

The source and drain electrodes 36 and 37 are formed on the third insulating layer 35 to contact the active layer 34 via the apertures 35a. The drain electrode 37 is connected to the pixel electrode 42.

A structure of the capacitor 20 will now be described. The capacitor 20 includes first electrode layers 21 and 22, a first insulating layer 25, and second electrode layer 26 that are sequentially stacked on the substrate 10.

The first electrode layers 21 and 22 are formed of the same layers as the above-described gate electrodes 31 and 32 of the TFT 30, respectively. The first electrode layers 21 and 22 may be formed as a multi layer structure, i.e., the first electrode 21 may be a transparent electrode layer and the first electrode 22 may be a low resistance electrode layer, similar to the respective gate electrodes 31 and 32.

The first insulating layer 25 is formed of the same layer as the third insulating layer 35 of the TFT 30.

The second electrode layer 26 is formed of the same layer as the source and drain electrodes 36 of the TFT 30. Further, the second electrode layer 26 is formed of a conductive metal material that is the same material for forming the source and drain electrodes 36 and 37.

As such, since only the first insulating layer 25 is interposed as a single layer between the first electrode layers 21 and 22 and the second electrode layer 26, e.g., the first insulating layer 25 may be a single layer directly between the first electrode layer 22 and the second electrode layer 26, the capacity of the capacitor 20 may be increased. That is, since the capacity of the capacitor 20 is inversely proportional to a distance between an uppermost surface of the first electrode layers 21 and 22, i.e., an uppermost surface of the first electrode layer 22, and the second electrode layer 26, a decreased distance between the uppermost surface of the first electrode layers 21 and 22 and the second electrode layer 26 may increase the capacity of the capacitor 20. In the organic light-emitting display device having the above-described structure, only the first insulating layer 25 is interposed between the first electrode layers 21 and 22 and the second electrode layer 26, and thus, a high capacity of the capacitor 20 can be easily secured. Also, as will be described in a method of manufacturing the organic light-emitting display device of FIG. 1, a structure in which only the first insulating layer 25 is interposed between the first electrode layers 21 and 22 and the second electrode layer 26 is naturally formed in a process of forming each layer constituting the organic light-emitting device 40, the TFT 30, and the capacitor 20, and thus, there is no need to perform an additional mask process.

Hereinafter, a method of manufacturing the organic light-emitting display device of FIG. 1 will be described with reference to FIGS. 2A-2F. FIGS. 2A through 2F are cross-sectional views for sequentially describing a method of manufacturing the organic light-emitting display device of FIG. 1.

Figure 2A:
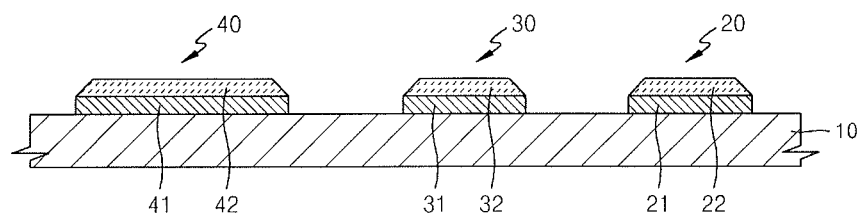
FIGS. 2A through 2F are cross-sectional views of stages in a method of manufacturing an organic light-emitting display device according to example embodiments.
Figure 2B:
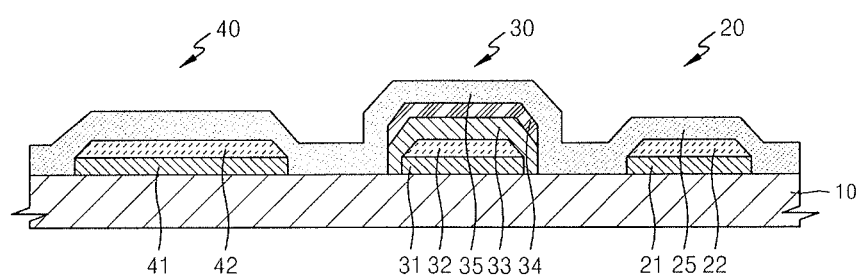

First, as illustrated in FIG. 2A, the first electrode layers 21 and 22 of the capacitor 20, the gate electrodes 31 and 32 of TFT 30, and the pixel electrodes 41 and 42 of the organic light-emitting device 40 are formed on the substrate 10. That is, the first electrode layer 21, the gate electrode 31, and the pixel electrode 41, which are transparent electrode layers, are formed, e.g., patterned, of a same first layer on, e.g., directly on, the substrate 10. Next, the first electrode layer 22, the gate electrode 32, and the pixel electrode 42, which are low resistance electrode layers, are formed, e.g., patterned, of a same second layer on, e.g., directly on, the first layer. Although not shown in FIG. 2A, a buffer layer may further be formed on the substrate 10. As the electrode layer 21, gate electrode 31, and pixel electrode 41 are formed of a same layer, they are formed simultaneously to a substantially same thickness, as measured from the substrate 10. Similarly, as the first electrode layer 22, gate electrode 32, and pixel electrode 42, are formed of a same layer, they are formed simultaneously to a substantially same thickness, as measured from the substrate 10. Each of the first electrode layer 22, gate electrode 32, and pixel electrode 42 overlaps, e.g., completely overlaps, a respective one of the electrode layer 21, gate electrode 31, and pixel electrode 41.

Then, as illustrated in 2B, the second insulating layer 33 covering the gate electrodes 31 and 32 of the TFT 30 is formed, followed by forming the active layer 34 on the second insulating layer 33. Next, an additional insulation layer is formed to cover the resultant structure, i.e., the pixel electrode 42, active layer 34, and first electrode 22. The additional insulation layer is a single layer having a first portion on the first electrode 22, i.e., first insulating layer 25, and a second portion on the pixel electrode 42 and active layer 34, i.e., third insulating layer 35. In other words, the first and third insulating layers 25 and 35 define a single continuous insulation layer overlapping the organic light-emitting device 40, the TFT 30, and the capacitor 20.

Figure 2C:
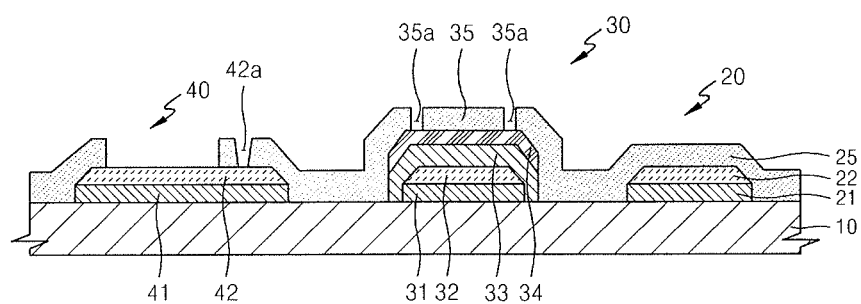
Figure 2D:
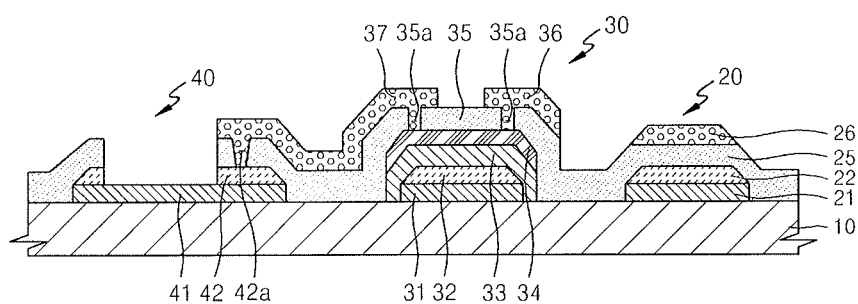

Next, the apertures 35*a* and 42*a* are formed in the third insulating layer 35, as illustrated in FIG. 2C. Then, the second electrode layer 26 of the capacitor 20 and the source and drain electrodes 36 and 37 of the TFT 30 are formed, as illustrated in FIG. 2D. At this time, the source electrode 36 is connected to the active layer 34 via the aperture 35*a*, and the drain electrode 37 is connected to the active layer 34 and the pixel electrode 42 respectively via the aperture 35*a* and the aperture 42*a*. When the source and drain electrodes 36 and 37 are patterned, a part of the pixel electrode 42 is etched, and thus, the pixel electrodes 41 and 42 may partially form a multi-layered structure.

As such, a basic structure of the capacitor 20 is completed, and thus, a stacked structure in which the first electrode layers 21 and 22, the first insulating layer 25, and the second electrode layer 26 are sequentially stacked is formed, as illustrated in FIG. 2D. The stacked structure in which an electrode layer, an insulating layer, and an electrode layer are sequentially stacked may increase the capacity of the capacitor 20.

In contrast, a conventional capacitor having a stacked structure may include a plurality of insulating layers between the first and second electrode layers, thereby decreasing capacity. However, as the capacitor 20 according to example embodiments include a single insulating layer is formed as a single layer between two electrode layers, a total thickness of the insulating layer is relatively decreased, thereby increasing the capacity of a capacitor. Also, since the first insulating layer 25 is formed at the same time as the third insulating layer 35 of the TFT 30, a number of manufacturing processes may be decreased, thereby reducing manufacturing costs.

Figure 2E:
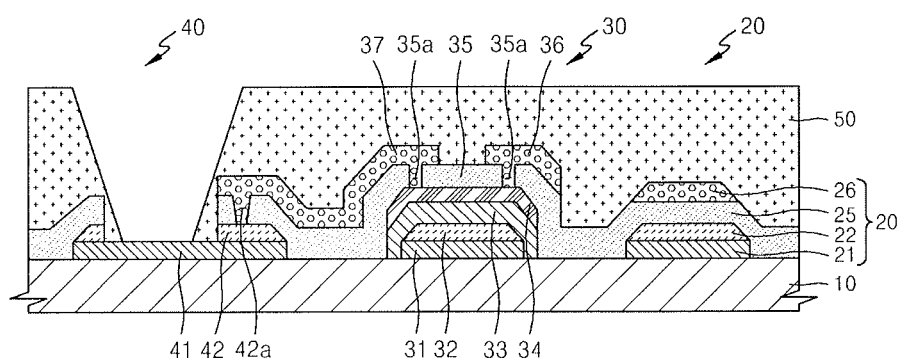
Figure 2F:
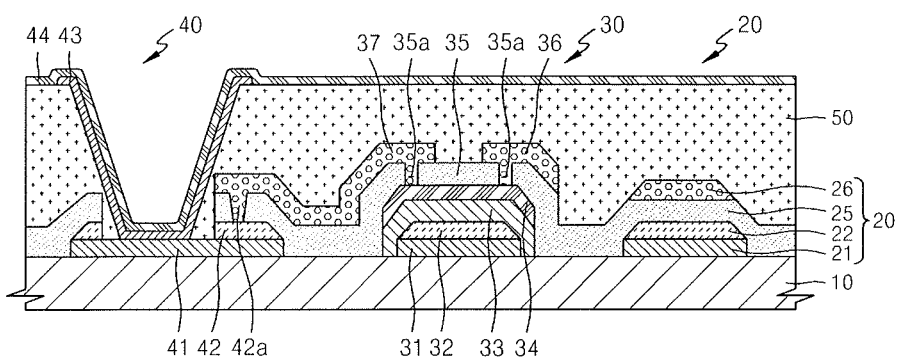

Then, as illustrated in FIG. 2E, the pixel-defining layer 50 is formed, followed by etching of the pixel-defining layer 50 to expose a part of the pixel electrode 41. Then, the organic emission layer 43 is formed on the exposed pixel electrode 41, followed by formation of the opposite electrode 44 on the organic emission layer 43 to complete the manufacturing of the organic light-emitting display device, as illustrated in FIG. 2F. A protection layer may further be formed on the organic light-emitting display device, and the organic light-emitting display device may be sealed with glass.

Therefore, as described above, in the organic light-emitting display device of the current embodiment, since an insulating layer is formed as a single layer between two electrodes of the capacitor 20, the capacity of the capacitor 20 may be increased without increasing the size of the capacitor 20. That is, the capacity of the capacitor 20 may be increased without reducing the size of an emission area of an organic light-emitting device. As such, the organic light-emitting device may display an image more stably and naturally.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. An organic light-emitting display device, comprising:
   an organic light-emitting device;
   a thin film transistor (TFT) electrically connected to the organic light-emitting device; and a capacitor electrically connected to the organic light-emitting device, the capacitor including a first electrode layer and a second electrode layer opposite to each other, and a first insulating layer interposed as a single layer directly between the first electrode layer and the second electrode layer, the second electrode layer having a same thickness as source/drain electrodes of the TFT,
   wherein the TFT includes:
   a gate insulating layer only on a gate electrode and sidewalls thereof, the gate insulating layer being different from the first insulating layer, the gate electrode including a same material with a same thickness as the first electrode layer of the capacitor, the gate electrode and the first electrode layer being positioned directly on a same element and having leveled upper surfaces; and
   a second insulating layer directly between an active layer and the source/drain electrodes, the second insulating layer being a continuous layer with the first insulating layer of the capacitor, the active layer directly on horizontal and projected portions of the gate insulating layer not covering vertical sidewall portions of the gate insulating layer, the source/drain electrodes on the second insulating layer and connected to the active layer, the source/drain electrodes including a same material as the second electrode layer of the capacitor,
   wherein the organic light-emitting device and the TFT are in a non-overlapping relationship.

2. The organic light-emitting display device of claim 1, wherein the first electrode layer includes a transparent electrode layer on a substrate, and a metal electrode layer on the transparent electrode layer, the metal electrode layer having a lower resistance than the transparent electrode layer, and the first insulating layer being directly between the metal electrode layer and the second electrode layer.

3. The organic light-emitting display device of claim 1, wherein the gate electrode includes a transparent electrode layer on a substrate, and a metal electrode layer on the transparent electrode layer, the metal electrode layer having a lower resistance than the transparent electrode layer.

4. The organic light-emitting display device of claim 1, wherein the organic light-emitting device includes a pixel electrode connected to the TFT, an opposing electrode opposite to the pixel electrode, and an organic emission layer interposed between the pixel electrode and the opposing electrode.

5. The organic light-emitting display device of claim 4, wherein the pixel electrode includes a transparent electrode layer on a substrate and connected to the organic emission layer, and a metal electrode layer on the transparent electrode layer and connected to the TFT.

6. A method of manufacturing an organic light-emitting display device, the method comprising:
  patterning a first layer on a substrate to form a pixel electrode of an organic light-emitting device, a gate electrode of a thin film transistor (TFT), and a first electrode layer of a capacitor;
  forming a gate insulating layer only on the gate electrode of the TFT;
  forming an active layer directly on horizontal and projected portions of the gate insulating layer not covering vertical sidewall portions of the gate insulating layer;
  depositing a second layer to define both a first insulating layer on the first electrode layer of the capacitor and a second insulating layer on the active layer, the first and second insulating layers being a single and continuous layer; and
  patterning a third layer to form a second electrode layer on the first insulating layer of the capacitor and source and drain electrodes on the second insulating layer of the TFT, the TFT being electrically connected to the organic light-emitting device,
  wherein the capacitor is electrically connected to the organic light-emitting device, the capacitor including the first electrode layer and the second electrode layer opposite to each other, and the first insulating layer interposed as a single layer directly between the first electrode layer and the second electrode layer, the second electrode layer having a same thickness as the source and drain electrodes of the TFT,
  wherein patterning the first layer on the substrate includes forming the gate electrode and the pixel electrode in a non-overlapping relationship.

7. The method of claim 6, wherein each of the first electrode layer, the gate electrode, and the pixel electrode includes a transparent electrode layer formed on the substrate and a metal electrode layer formed on the transparent electrode layer, the metal electrode layer having a lower resistance than the transparent electrode layer.

8. The method of claim 6, further comprising:
  forming an organic emission layer on the pixel electrode; and
  forming an opposing electrode on the organic emission layer.

9. The method of claim 8, wherein the organic emission layer is formed on the exposed pixel electrode, and the pixel electrode is partially exposed by etching a pixel-defining layer formed on the pixel electrode.

10. The method of claim 6, wherein forming the TFT includes sequentially forming the gate electrode, the gate insulating layer, the active layer, the second insulating layer, and the source and drain electrodes, in the stated order, on the substrate, such that the first and second insulating layers are formed simultaneously by depositing a single layer.

11. The organic light-emitting display device of claim 1, wherein the first insulating layer is in direct contact with each of the first electrode layer and the second electrode layer, the second electrode layer being a single layer consisting essentially of metal.

12. The organic light-emitting display device of claim 1, wherein the first insulating layer extends continuously to directly contact a portion of a substrate between the capacitor and the TFT, and further extends continuously in direct contact with each of the active layer and the source/drain electrodes in the TFT.

13. The method of claim 6, wherein patterning the first layer on the substrate includes forming each of the pixel electrode, the gate electrode, and the first electrode at a same distance from an upper surface of the substrate.

14. The method of claim 6, wherein depositing the second layer further comprises defining an extension insulating layer on the substrate and on the pixel electrode, the extension insulating layer being continuous with the second insulating layer, and the TFT being electrically connected to the organic light emitting device through the extension insulating layer.

15. The organic light-emitting display device of claim 4, wherein the pixel electrode of the organic light-emitting device, the gate electrode, and the first electrode layer of the capacitor are directly on a substrate, the pixel electrode, the gate electrode, and the first electrode layer of the capacitor having upper surfaces that are completely level with each other.

16. The organic light-emitting display device of claim 1, wherein the gate electrode and the first electrode layer of the capacitor have completely flat uppermost surfaces, the uppermost surfaces of the gate electrode and the first electrode layer facing the gate insulating layer and the first insulating layer, respectively.

* * * * *